United States Patent
Chun

(10) Patent No.: US 10,706,763 B2
(45) Date of Patent: Jul. 7, 2020

(54) ORGANIC LIGHT EMITTING DIODE DISPLAY DEVICE FOR MOVING IMAGE AND METHOD FOR OPERATING THEREOF

(71) Applicant: LG ELECTRONICS INC., Seoul (KR)

(72) Inventor: Youngho Chun, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 16/173,813

(22) Filed: Oct. 29, 2018

(65) Prior Publication Data
US 2019/0156726 A1    May 23, 2019

(30) Foreign Application Priority Data

Nov. 21, 2017  (KR) .......................... 10-2017-0155798

(51) Int. Cl.
| | |
|---|---|
| *G09G 3/30* | (2006.01) |
| *G09G 3/20* | (2006.01) |
| *G09G 3/3233* | (2016.01) |
| *H01L 27/32* | (2006.01) |
| *G09G 3/3291* | (2016.01) |
| *G09G 5/00* | (2006.01) |
| *G09G 3/3258* | (2016.01) |
| *G09G 3/00* | (2006.01) |

(52) U.S. Cl.
CPC ......... *G09G 3/2003* (2013.01); *G09G 3/3233* (2013.01); *G09G 3/3258* (2013.01); *G09G 3/3291* (2013.01); *G09G 5/003* (2013.01); *H01L 27/3276* (2013.01); *G09G 3/007* (2013.01); *G09G 2300/0426* (2013.01); *G09G 2300/0452* (2013.01); *G09G 2320/0257* (2013.01); *G09G 2320/043* (2013.01); *G09G 2320/0626* (2013.01); *G09G 2320/0666* (2013.01); *H01L 27/3211* (2013.01); *H01L 27/3244* (2013.01)

(58) Field of Classification Search
CPC .. G09G 3/2003; G09G 3/3258; G09G 3/3233; G09G 3/3291; G09G 5/003; G09G 3/007; H01L 27/3276; H01L 27/3211; H01L 27/3244
See application file for complete search history.

(56) References Cited

U.S. PATENT DOCUMENTS 9,966,003 B2    5/2018  Cho et al.
2004/0252135 A1* 12/2004 Ono ..................... G09G 3/007
                                              345/619
(Continued)

FOREIGN PATENT DOCUMENTS

| KR | 10-2006-0195840 A | 10/2006 |
| KR | 10-2007-0079164 A | 8/2007 |
(Continued)

*Primary Examiner* — Adam J Snyder
(74) *Attorney, Agent, or Firm* — Birch, Stewart, Kolasch & Birch, LLP

(57) ABSTRACT

An organic light emitting diode (OLED) display device including a display unit including pixels constituted by OLEDs; and a controller configured to display an image through the display unit, acquire an average picture level (APL) of the image, set a movement path and a movement period of the image on the display based on the acquired APL, and move the image on the display unit based on the set movement path and the movement period.

17 Claims, 13 Drawing Sheets

(56) References Cited

U.S. PATENT DOCUMENTS

| | | | |
|---|---|---|---|
| 2005/0018046 A1* | 1/2005 | Tsuzuki | G09G 3/007 348/173 |
| 2005/0204313 A1* | 9/2005 | Enoki | G09G 3/007 715/867 |
| 2007/0236410 A1* | 10/2007 | Shimizu | G09G 3/20 345/20 |
| 2008/0002239 A1* | 1/2008 | Toma | G06T 3/4023 358/474 |
| 2008/0111886 A1 | 5/2008 | Bai | |
| 2011/0043551 A1* | 2/2011 | Kikuta | G09G 3/3233 345/691 |
| 2015/0077406 A1* | 3/2015 | Lee | G09G 3/3648 345/204 |
| 2016/0111034 A1* | 4/2016 | Lee | G09G 3/20 345/213 |
| 2016/0163258 A1 | 6/2016 | Cho et al. | |
| 2016/0189619 A1* | 6/2016 | Park | G09G 3/3258 345/690 |
| 2017/0221455 A1* | 8/2017 | Lee | G09G 3/3233 |
| 2018/0012530 A1* | 1/2018 | Lee | G09G 3/007 |
| 2019/0088194 A1* | 3/2019 | Chun | G09G 3/20 |

FOREIGN PATENT DOCUMENTS

| | | |
|---|---|---|
| KR | 10-2008-0042997 A | 5/2008 |
| KR | 10-2016-0019341 A | 2/2016 |
| KR | 10-2916-0068443 A | 6/2016 |

* cited by examiner

ORGANIC LIGHT EMITTING DIODE DISPLAY DEVICE FOR MOVING IMAGE AND METHOD FOR OPERATING THEREOF

CROSS-REFERENCE TO RELATED APPLICATIONS

The present application claims priority under 35 U.S.C. § 119 and 35 U.S.C. § 365 to Korean Patent Application No. 10-2017-0155798 (filed on Nov. 21, 2017), which is hereby incorporated by reference in its entirety.

TECHNICAL FIELD

The present disclosure relates to an organic light emitting diode display device, and more particularly, to an organic light emitting diode display device that reduces an afterimage phenomenon thereof and a method for operating the same.

BACKGROUND

Recently, as the use of various smart devices and high-resolution large screens as well as televisions has increased, the types of display devices have been diversified. In particular, a variety of flat panel displays (FPDs) have been developed which may further reduce the weight and volume than a so-called cathode ray tube (CRT). Specifically, flat panel displays, such as liquid crystal displays (LCDs), thin film transistor-liquid crystal displays (TFT-LCDs), plasma display panels (PDPs), and electroluminescence devices have attracted attention.

The electroluminescence devices may be classified into an inorganic light emitting diode and an organic light emitting diode (OLED) according to a material of an emitting layer. The OLED is a self-luminous organic material that emits light by itself by using an electroluminescence phenomenon that light is emitted when a current flows through a fluorescent organic compound. The OLED can be driven at a low voltage and made light and thin. Additionally, since each device is a luminous type that emits light, light is adjusted by changing a current flowing through each device. Thus, a backlight is not required. An OLED display device implemented with such OLEDs has advantages such as a fast response time, high image quality, high luminescent efficiency, an ultra-thin structure, and a wide viewing angle.

Due to the above advantages, the prospect of the OLED display device is bright, and the demand for the OLED display device is increasing. In the OLED display device, since each of elements of the OLED display device emits light, the elements may be different from each other in frequency of use and thus be different from each other in lifetime. For example, a logo included the broadcast content, an item on a menu screen, or the like is fixed to a specific position on the screen and continuously displayed.

In addition, the logo or item may have relatively high brightness in terms of visibility. In this instance, an element disposed on an area on which the logo or item is displayed may continuously emit light having the high brightness and thus be significantly reduced in lifetime when compared with elements disposed on other areas. When the element included in the area is significantly reduced in lifetime, the light emitted from the element may be reduced in brightness. As a result, an afterimage may occur due to a difference in brightness between the areas on a specific screen, and thus, the user may feel inconvenience when viewing an image through the OLED display device.

SUMMARY

Embodiments provide an organic light emitting diode display device that more effectively reduces an afterimage phenomenon occurring on a display unit.

In one embodiment, an organic light emitting diode display device includes: a display unit including pixels constituted by organic light emitting diodes; and a controller displaying an image through the display unit, acquiring an average picture level (APL) of the image, setting a movement path and a movement period based on the acquired APL, and allows the image to move to be displayed on the display unit based on the movement path and the movement period.

In another embodiment, a method for operating an organic light emitting diode display device includes: displaying an image through a display unit; acquiring an APL of the image; setting a movement path and a movement period based on the acquired APL; and allowing the image to move to be displayed on the display unit based on the movement path and the movable period.

The details of one or more embodiments are set forth in the accompanying drawings and the description below. Other features will be apparent from the description and drawings, and from the claims.

BRIEF DESCRIPTION OF THE DRAWINGS

The present invention will become more fully understood from the detailed description given hereinbelow and the accompanying drawings, which are given by illustration only, and thus are not limitative of the present invention, and wherein.

DETAILED DESCRIPTION OF THE EMBODIMENTS

Hereinafter, embodiments relating to the present disclosure will be described in detail with reference to the accompanying drawings. The suffixes "module" and "unit" for components used in the description below are assigned or mixed in consideration of easiness in writing the specification and do not have distinctive meanings or roles by themselves.

A display device according to an embodiment, for example, as an intelligent display device that adds a computer supporting function to a broadcast receiving function, may have an easy-to-use interface such as a writing input device, a touch screen, or a spatial remote control device as an internet function is added while fulfilling the broadcast receiving function. Then, with the support of a wired or wireless internet function, it is possible to perform an e-mail, web browsing, banking, or game function in access to internet and computers. In order for such various functions, standardized general purpose OS may be used.

Accordingly, since various applications are freely added or deleted on a general purpose OS kernel, a display device described in this embodiment, for example, may perform various user-friendly functions. The display device, in more detail, may be a network TV, HBBTV, smart TV, LED TV, OLED TV, and so on and in some cases, may be applied to a smartphone.

Figure 1:
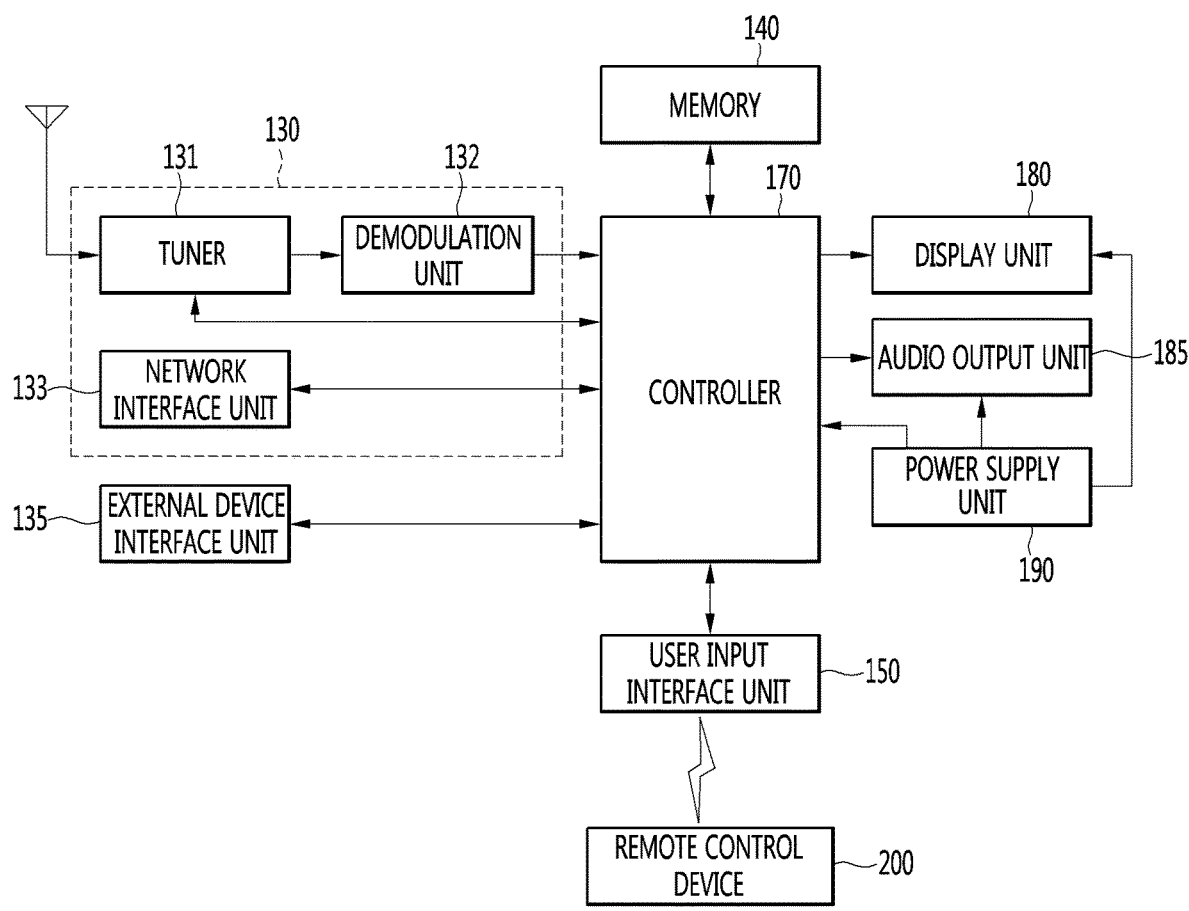
FIG. 1 is a block diagram illustrating a configuration of a display device according to an embodiment.

FIG. 1 is a block diagram illustrating a configuration of a display device according to an embodiment. Referring to FIG. 1, the display device 100 may include a broadcast reception unit 130, an external device interface unit 135, a memory 140, a user input interface unit 150, a controller 170, a short-range communication unit 173, a display unit 180, an audio output unit 185, and a power supply unit 190.

The broadcast reception unit 130 may include a tuner 131, a demodulation unit 132, and a network interface unit 133. The tuner 131 can select a specific broadcast channel according to a channel selection command, and receive broadcast signals for the selected specific broadcast channel.

Further, the demodulation unit 132 can divide the received broadcast signals into video signals, audio signals, and broadcast program related data signals and restore the divided video signals, audio signals, and data signals to an output available form. The external device interface unit 135 can receive an application or an application list of an adjacent external device and transfer the application or the application list to the controller 170 or the memory 140.

The external device interface unit 135 can provide a connection path between the display device 100 and the external device. The external device interface unit 135 can also receive an image and/or an audio output from the external device and transfers the image and/or the audio to the controller 170. The external device connectable to the external device interface unit 135 may be one of a set-top box, a Blu-ray player, a DVD player, a game console, a sound bar, a smartphone, a PC, a USB memory, and a home theater system.

In addition, the network interface unit 133 can provide an interface for connecting the display device 100 to a wired/wireless network including an Internet network. The network interface unit 133 can transmit or receive data to or from another user or another electronic device through an accessed network or another network linked to the accessed network.

Additionally, the network interface unit 133 can transmit a part of content data stored in the display device 100 to a user or an electronic device selected from other users or other electronic devices preregistered in the display device 100. The network interface unit 133 can access a predetermined webpage through the accessed network or another network linked to the accessed network. That is, the network interface unit 133 can access the predetermined webpage through the network and transmit or receive data to or from a corresponding server.

Further, the network interface unit 133 can receive content or data provided by a content provider or a network operator. That is, the network interface unit 133 can receive content (e.g., movies, advertisements, games, VOD, broadcast signals, etc.) and content-related information provided from the content provider or the network operator through the network.

Additionally, the network interface unit 133 can receive update information and update files of firmware provided by the network operator and transmit data to the Internet or content provider or the network operator. The network interface unit 133 can select and receive a desired application among applications, which are open to the public, through the network.

Further, the memory 140 can store a program for signal processing and control in the controller 170 and may store signal-processed image, voice, or data signals. Additionally, the memory 140 can perform a function for temporarily storing image, voice, or data signals input from the external device interface unit 135 or the network interface unit 133 and store information on a predetermined image through a channel memory function. The memory 140 can also store an application or an application list input from the external device interface unit 135 or the network interface unit 133.

In addition, the display device 100 can reproduce content files (e.g., moving image files, still image files, music files, document files, application files, etc.) stored in the memory 140 so as to provide the content files to the user. Further, the user input interface unit 150 can transfer signals input by the user to the controller 170 or transfer signals from the controller 170 to the user.

For example, the user input interface unit 150 can receive and process control signals such as power on/off, channel selection, or screen setup from the remote control device 200 or transmit control signals from the controller 170 to a remote control device 200, according to various communication methods such as Bluetooth, Ultra Wideband (WB), ZigBee, Radio Frequency (RF) communication scheme, or infrared (IR) communication scheme. Additionally, the user input interface unit 150 can transfer, to the controller 170, control signals input from local keys such as a power key, a channel key, a volume key, and a setting key.

Image signals that are image-processed by the controller 170 can be input to the display unit 180 and displayed as an image corresponding to the image signals. Additionally, image signals that are image-processed by the controller 170 can be input to an external output device through the external device interface unit 135. Also, voice signals that are processed by the controller 170 can be output as audio to the audio output unit 185. Additionally, image signals that are processed by the controller 170 can be input to an external output device through the external device interface unit 135.

In addition, the controller 170 can control an overall operation of the display device 100. Additionally, the controller 170 can control the display device 100 by a user command input through the user input interface unit 150 or an internal program and can connect to the network to download an application or an application list desired by the user into the display device 100. The controller 170 can also output channel information selected by the user through the display unit 180 or the audio output unit 185 together with the processed image or voice signals.

Additionally, the controller 170 can output the image signal or the voice signal, which is input from the external device (e.g., a camera or a camcorder) through the external device interface unit 135, to the display unit 180 or the audio output unit 185 according to an external device image reproduction command received through the user input interface unit 150. Further, the controller 170 can control the display unit 180 to display images. For example, the controller 170 can control the display unit 180 to display broadcast images input through the tuner 131, external input images input through the external device interface unit 135, images input through the network interface unit, or images stored in the memory 140. In this instance, an image displayed on the display unit 180 may be a still image or video, and may be a 2D image or a 3D image.

Additionally, the controller 170 can perform control to reproduce content stored in the display device 100, received broadcast content, or external input content input from the outside. The content may be various types, such as a broadcast image, an external input image, an audio file, a still image, a connected web screen, a document file, and the like.

The short-range communication unit 173 can perform a wired or wireless communication with an external device. The short-range communication unit 173 can also perform short-range communication with an external device. Thus, the short-range communication unit 173 may support short-range communication by using at least one of Bluetooth™, Radio Frequency Identification (RFID), Infrared Data Association (IrDA), Ultra Wideband (UWB), ZigBee, Near Field Communication (NFC), Wireless-Fidelity (Wi-Fi), Wi-Fi Direct, and Wireless Universal Serial Bus (USB) technologies. The short-range communication unit 173 may support wireless communication between the display device 100 and a wireless communication system, between the display device 100 and another display device 100, or between networks including the display device 100 and another display device 100 (or an external server) through wireless area networks. In addition, the wireless area networks may be wireless personal area networks.

Herein, the other display device 100 may be a mobile terminal such as a wearable device (for example, a smart watch, a smart glass, and a head mounted display (HMD)) or a smartphone, which is capable of exchanging data (or interworking) with the display device 100. The short-range communication unit 173 can detect (or recognize) a communicable wearable device around the display device 100. Furthermore, if the detected wearable device is a device authenticated to communicate with the display device 100 according to an embodiment, the controller 170 can transmit at least part of data processed by the display device 100 to the wearable device through the short-range communication unit 173. Accordingly, a user of the wearable device can use the data processed by the display device 100 through the wearable device.

In addition, the display unit 180 can generate a driving signal by converting an image signal, a data signal, or an OSD signal, which is processed by the controller 170, or an image signal or a data signal, which is received by the external device interface unit 135, into R, G, and B signals. Further, the display device 100 shown in FIG. 1 is merely one embodiment, and some of the illustrated elements may be integrated, added, or omitted according to the specification of the display device 100 to be actually implemented.

That is, if necessary, two or more elements may be integrated into one element, or one element may be divided into two or more elements. Additionally, the function performed by each block is provided illustrating the embodiments of the present disclosure, and a specific operation or device thereof does not limit the scope of the present disclosure.

According to another embodiment, the display device 100 may not include the tuner 131 and the demodulation unit 132, unlike that shown in FIG. 1, and can receive an image through the network interface unit 133 or the external device interface unit 135 and reproduce the received image. For example, the display device 100 may be divided into an image processing device such as a set-top box for receiving a broadcast signal or content provided by various network services, and a content reproduction device for reproducing content input from the image processing device.

In this instance, an operating method of the display device according to an embodiment, which will be described below, can be performed by the display device 100 described above with reference to FIG. 1, or can be performed by any one of the image processing device such as the set-top box and the content reproduction device including the display unit 180 and the audio output unit 185.

Next, the remote control device according to an embodiment will be described with reference to FIGS. 2 and 3. In particular, FIG. 2 is a block diagram of the remote control device 200 according to an embodiment, and FIG. 3 illustrates an actual configuration example of the remote control device 200 according to an embodiment of the present disclosure.

Figure 2:
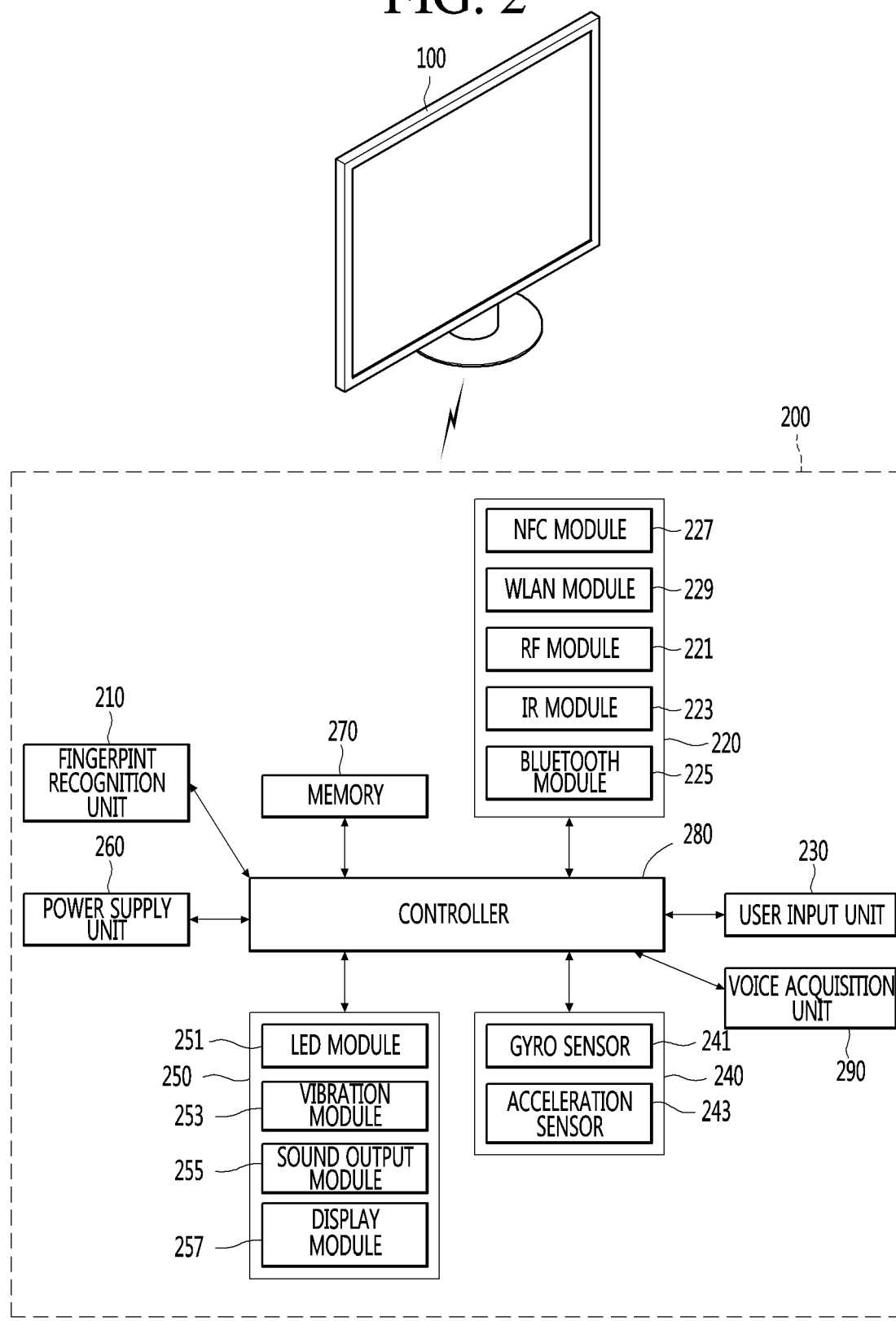
FIG. 2 is a block diagram illustrating a remote control device according to an embodiment.
Figure 3:
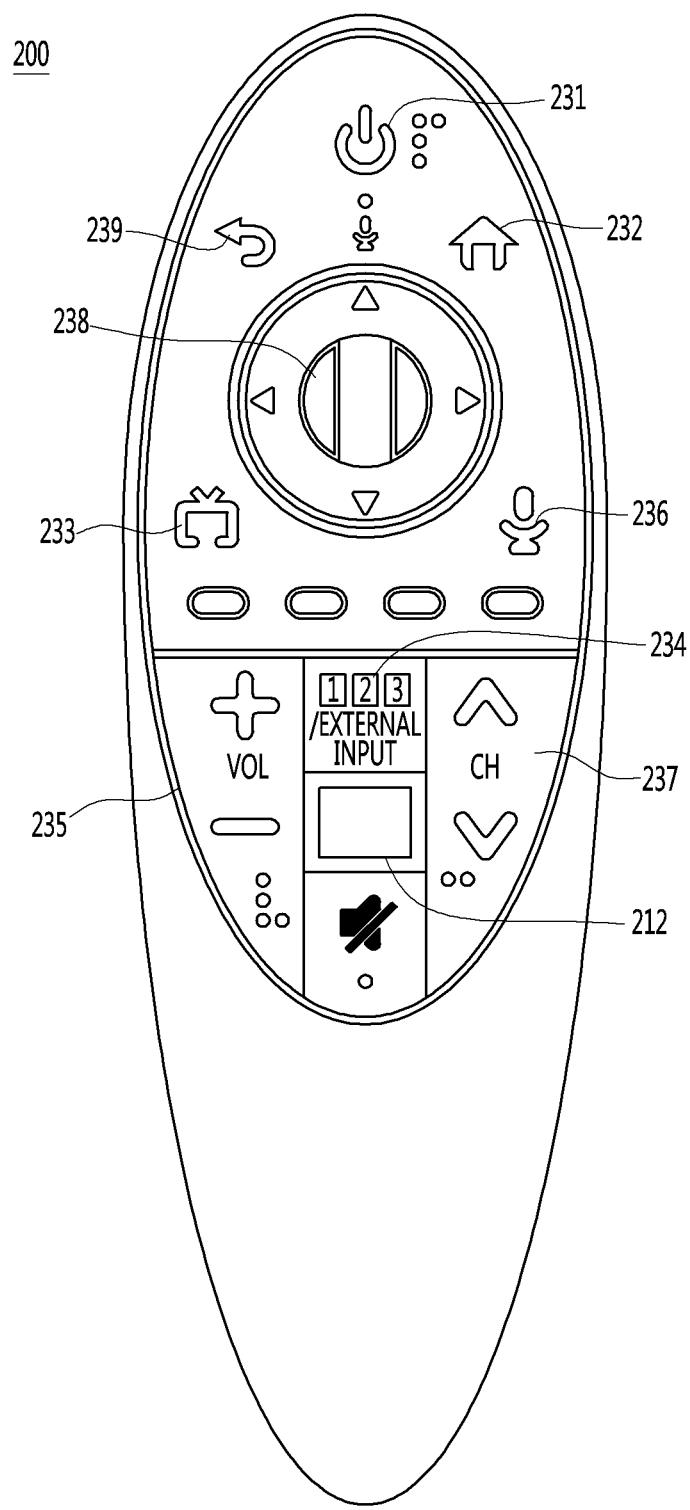
FIG. 3 is a view illustrating an actual configuration of a remote control device according to an embodiment.

First, referring to FIG. 2, the remote control device 200 may include a fingerprint recognition unit 210, a wireless communication unit 220, a user input unit 230, a sensor unit 240, an output unit 250, a power supply unit 260, a memory 270, a controller 280, and a voice acquisition unit 290. Referring to FIG. 2, the wireless communication unit 220 transmits and receives a signal to and from any one of the display devices according to the aforementioned embodiments.

The remote control device 200 may include an RF module 221 configured to transmit and receive a signal to and from the display device 100 according to an RF communication standard, and an IR module 223 configured to transmit and receive a signal to and from the display device 100 according to an IR communication standard. Additionally, the remote control device 200 may include a Bluetooth module 225 configured to transmit and receive a signal to and from the display device 100 according to a Bluetooth communication standard. Additionally, the remote control device 200 may include a Near Field Communication (NFC) module 227 configured to transmit and receive a signal to and from the display device 100 according to an NFC communication standard, and a Wireless LAN (WLAN) module 229 configured to transmit and receive a signal to and from the display device 100 according to a WLAN communication standard.

Additionally, the remote control device 200 can transmit signals containing information on a movement of the remote control device 200 to the display device 100 through the wireless communication unit 220. Further, the remote control device 200 can receive a signal transmitted by the display device 100 through the RF module 221 and, if necessary, can transmit a command for power on/off, channel change, volume change, or the like to the display device 100 through the IR module 223.

The user input unit 230 may include a keypad, a button, a touch pad, or a touch screen. The user can operate the user input unit 230 to input a command associated with the display device 100 to the remote control device 200. When the user input unit 230 includes a hard key button, the user can push the hard key button to input a command associated with the display device 100 to the remote control device 200. This will be described below with reference to FIG. 3.

Referring to FIG. 3, the remote control device 200 may include a plurality of buttons. The plurality of buttons may include a fingerprint recognition button 212, a power button 231, a home button 232, a live button 233, an external input button 234, a volume control button 235, a voice recognition button 236, a channel change button 237, a check button 238, and a back button 239.

The fingerprint recognition button 212 may be a button for recognizing a user's fingerprint. According to an embodiment, the fingerprint recognition button 212 can perform a push operation and receive a push operation and a fingerprint recognition operation. The power button 231 may be a button for turning on or off the power of the display device 100. The home button 232 may be a button for moving to a home screen of the display device 100. The live button 233 may be a button for displaying a broadcast program in real time. The external input button 234 may be a button for receiving an external input connected to the display device 100. The volume control button 235 may be a button for adjusting a volume output from the display device 100. The voice recognition button 236 may be a button for receiving a voice of a user and recognizing the received voice. The channel change button 237 may be a button for receiving a broadcast signal of a specific broadcast channel. The check button 238 may be a button for selecting a specific function, and the back button 239 may be a button for returning to a previous screen.

Again, FIG. 2 is described. If the user input unit 230 includes a touch screen, a user can touch a soft key of the touch screen to input a command associated with the display device 100 to the remote control device 200. Additionally, the user input unit 230 may include various types of input units operated by a user, for example, a scroll key or a jog key, and this embodiment does not limit the scope of the present disclosure.

The sensor unit 240 may include a gyro sensor 241 or an acceleration sensor 243, and the gyro sensor 241 can sense information on the movement of the remote control device 200. For example, the gyro sensor 241 can sense information on the operation of the remote control device 200 based on x, y, and z axes, and the acceleration sensor 243 can sense information on a movement speed of the remote control device 200. Moreover, the remote control device 200 may further include a distance measurement sensor and sense a distance from the remote control device 200 to the display unit 180 of the display device 100.

The output unit 250 can output image or voice signals in response to operation of the user input unit 230 or image or voice signals corresponding to signals transmitted from the display device 100. A user can recognize whether the user input unit 230 is operated or the display device 100 is controlled through the output unit 250. For example, the output unit 250 may include an LED module 251 for flashing, a vibration module 253 for generating a vibration, a sound output module 255 for outputting a sound, or a display module 257 for outputting an image, if the user input unit 230 is operated or signals are transmitted and received to and from the display device 100 through the wireless communication unit 220.

Additionally, the power supply unit 260 supplies power to the remote control device 200 and, if the remote control device 200 does not move during a predetermined period of time, stops supplying power, so that power waste can be reduced. The power supply unit 260 can resume the supply of power if a predetermined key provided in the remote control device 200 is operated.

The memory 270 can store various types of programs and application data necessary for the control or operation of the remote control device 200. If the remote control device 200 transmits and receives signals wirelessly through the display device 100 and the RF module 221, the remote control device 200 and the display device 100 transmit and receive signals through a predetermined frequency band.

Further, the controller 280 of the remote control device 200 can store, in the memory 270, information on a frequency band for transmitting and receiving signals wirelessly to and from the display device 100 paired with the remote control device 200 and refer to the information. The controller 280 also controls the overall operation of the remote control device 200. For example, the controller 280 can transmit a signal corresponding to a predetermined key operation of the user input unit 230 or a signal corresponding to a movement of the remote control device 200 sensed by the sensor unit 240 to the display device 100 through the wireless communication unit 220.

Additionally, the voice acquisition unit 290 of the remote control device 200 can obtain a voice. The voice acquisition unit 290 may include at least one microphone 291 and acquire a voice through the microphone 291.

Figure 4:
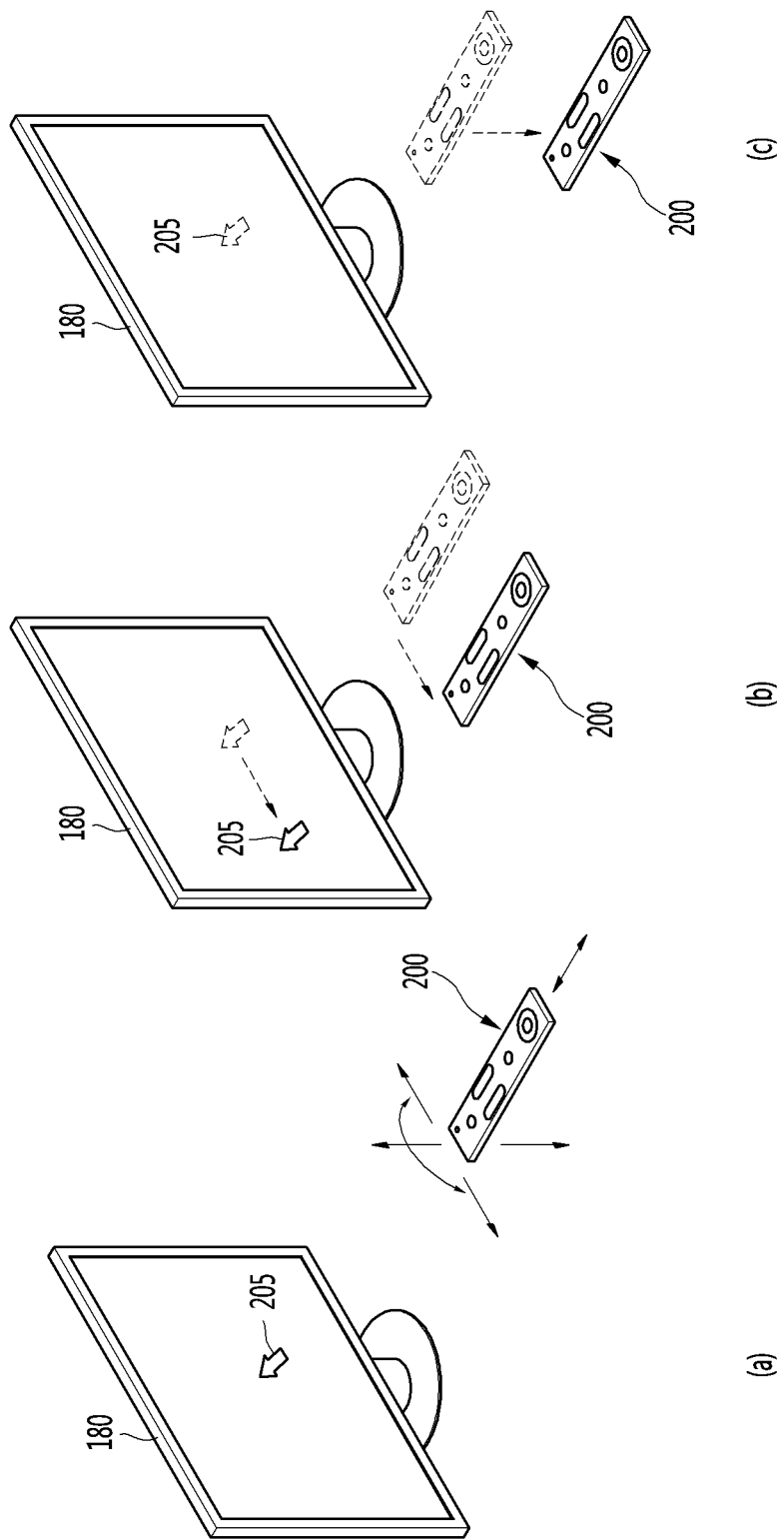
FIG. 4 is a view of utilizing a remote control device according to an embodiment.

Next, FIG. 4 is described. In particular, FIG. 4 illustrates an example of utilizing the remote control device according to an embodiment. FIG. 4(a) illustrates an example in which a pointer 205 corresponding to the remote control device 200 is displayed on the display unit 180.

A user can move or rotate the remote control device 200 vertically or horizontally. The pointer 205 displayed on the display unit 180 of the display device 100 corresponds to the movement of the remote control device 200. Since the pointer 205 is moved and displayed according to a movement on a 3D space as shown in the drawing, the remote control device 200 may also be referred to as a spatial remote control device.

FIG. 4(b) illustrates an example in which if a user moves the remote control device 200 to the left, the pointer 205 displayed on the display unit 180 of the display device 100 is also moved to the left according to the movement of the remote control device 200. Information on the movement of the remote control device 200 detected through a sensor of the remote control device 200 is transmitted to the display device 100. In addition, the display device 100 can calculate the coordinates of the pointer 205 from the information on the movement of the remote control device 200. The display device 100 can also display the pointer 205 at a position corresponding to the calculated coordinates.

FIG. 4(c) illustrates an example in which while a specific button in the remote control device 200 is pressed, a user moves the remote control device 200 away from the display unit 180. Due to this, a selection area in the display unit 180 corresponding to the pointer 205 can be zoomed in and displayed larger. On the contrary, if a user moves the remote control device 200 in a direction closer to the display unit 180, a selection area in the display unit 180 corresponding to the pointer 205 can be zoomed out and displayed in a reduced size.

Further, if the remote control device 200 is moved away from the display unit 180, a selection area can be zoomed out, and if the remote control device 200 is moved closer to the display unit 180, a selection area can be zoomed in. Additionally, if a specific button in the remote control device 200 is pressed, recognition of a vertical or horizontal movement may be excluded. That is, if the remote control device 200 is moved away from or closer to the display unit 180, the up, down, left, or right movement can not be recognized and only the back and forth movement can be recognized. While a specific button in the remote control device 200 is not pressed, only the pointer 205 is moved according to the up, down, left, or right movement of the remote control device 200.

The moving speed or moving direction of the pointer 205 may correspond to the moving speed or moving direction of the remote control device 200. Further, the pointer 205 in this specification means an object displayed on the display unit 180 in response to the operation of the remote control device 200. Accordingly, besides an arrow form displayed as the pointer 205 in the drawing, various forms of objects are possible. For example, the above concept includes a point, a cursor, a prompt, and a thick outline. The pointer 205 can be displayed corresponding to one point of a horizontal axis and a vertical axis on the display unit 180 and can also be displayed corresponding to a plurality of points such as a line and a surface.

Figure 5:
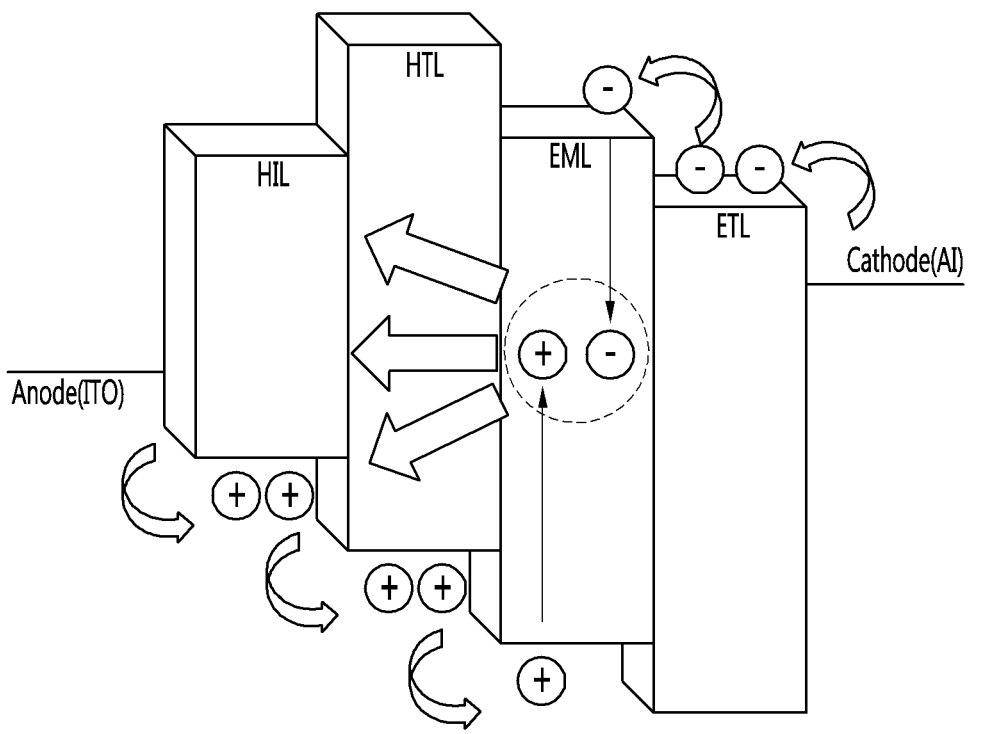
FIG. 5 is a view illustrating a driving principle of an OLED included in an OLED display device according to an embodiment.

Next, a driving principle of an OLED will be described with reference to FIG. 5. In particular, FIG. 5 is a view illustrating a driving principle of an OLED included in an OLED display device according to an embodiment. An OLED has a structure in which a transparent indium tin oxide (ITO) anode layer is formed on a transparent substrate such as glass, and a multi-layered thin film of organic materials having different transport capabilities and a cathode of an Mg—Ag alloy are sequentially formed on the anode layer.

The anode layer includes an anode and a cathode, and the anode layer includes a transparent electrode, such as ITO, so that light generated in an emitting layer is transmitted toward the outside. Since the OLED is a charge injection type light emitting device, charge injection efficiency between interfaces is a factor that has the greatest influence on the performance of the device.

The emitting layer (EML) is a layer in which holes (+) passing through the anode and electrons (−) passing through the cathode recombine to generate light. Specifically, in the OLED, as a voltage is applied between two electrodes, holes and electrons are injected from the anode and the cathode, respectively, and when the holes and the electrons reach the emitting layer, the holes and the electrons recombine in the emitting layer to form excitons of an excited state. Light is obtained by emission recombination of the excitons and becomes a ground state. At this time, an emission wavelength is determined by energy of exciton, that is, an energy difference between HOMO and LUMO, and the generated light is emitted toward the transparent electrode (anode). The light generated in the emitting layer emits red, blue, and green colors, and a spectrum thereof is determined according to bond energy in the emitting layer. Therefore, an emission color is determined according to a material for forming the emitting layer.

Additionally, the OLED further includes a hole injection layer (HIL), a hole transfer layer (HTL), and an electron transfer layer (ETL), which enable the holes and the electrons to be easily moved to the emitting layer. The hole transfer layer uses an electron donating molecule having small ionization potential so as to facilitate hole injection from the anode. Diamine, triamine, or tetramine derivatives having triphenylamine as a basic are mainly used.

The electron transfer layer is a layer that smoothly transfers electrons supplied from the cathode to the emitting layer and suppresses the movement of holes not bonded in the emitting layer, thereby increasing recombination probability in the emitting layer. The electron transfer layer is required to have excellent electron affinity and adhesion to the cathode electrode.

Figure 6:
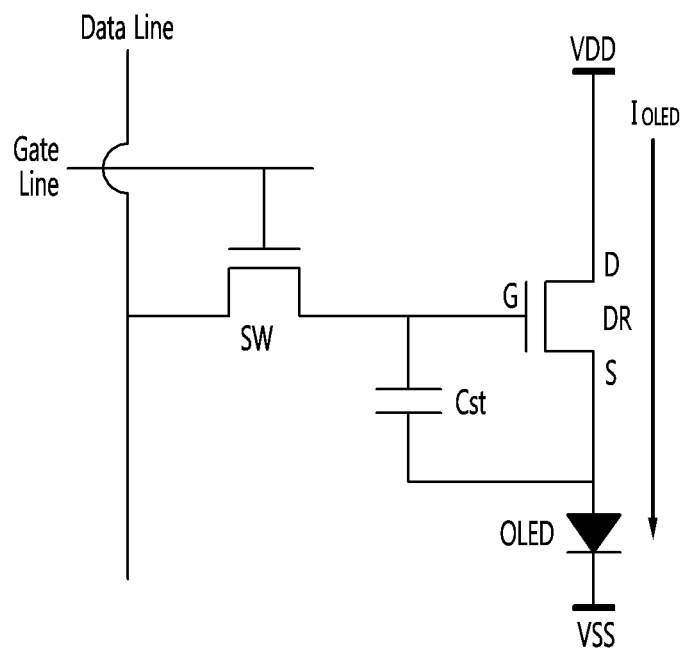
FIG. 6 is an equivalent circuit diagram of a pixel to which the OLED of FIG. 5 is connected, according to an embodiment.

Next, the operation of a pixel circuit, to which the OLED is connected, will be described with reference to FIG. 6. In particular, FIG. 6 is an equivalent circuit diagram of a pixel to which the OLED of FIG. 5 is connected, according to an embodiment. The pixel of the OLED display device generally includes two transistors and one capacitor (2T1C). Specifically, referring to FIG. 6, the pixel of the OLED display device includes a data line and a gate line intersecting with each other, a switch TFT SW, a drive TFT DR, and a storage capacitor Cst.

The switch TFT SW is turned on in response to a scan pulse from the gate line so that a current path is formed between a source electrode and a drain electrode thereof. During on-time duration of the switch TFT SW, a data voltage from the data line is applied to a gate electrode of the drive TFT DR and one electrode of the storage capacitor Cst through the source electrode and the drain electrode of the switch TFT SW.

The storage capacitor Cst stores a difference voltage between the data voltage and a high-potential driving voltage VDD and constantly maintains the difference voltage during one frame period, and the drive TFT DR controls a current IOLED flowing through the OLED according to the data voltage applied to the gate electrode thereof. The source-drain voltage of the TFT is determined by the driving voltage VDD applied to the OLED.

Next, FIGS. 7A to 7D are views illustrating an orbit operation of the OLED display device. In the OLED display device 100 (hereinafter, referred to as a "display device"), since each of the OLED elements provided in the display unit 180 emits light, the OLED elements may be different from each other in frequency of use and thus be different from each other in lifetime. For example, when a specific element emits light having high brightness for a long time, the element may be degraded to cause a difference in lifetime with adjacent elements. Thus, even though the same data as that of the adjacent elements is output, light having relatively low brightness may be emitted to cause an afterimage phenomenon on a screen by a difference in brightness.

To reduce the afterimage phenomenon, the display device 100 can perform an orbit operation when an image is displayed. The orbit operation can be defined as an operation of an image displayed on the display unit 180, which operates by a predetermined pixel for a predetermined period along a movement path. The degradation of the OLED element can be dispersed by the orbit operation to reduce the difference in lifetime with the adjacent elements and also reduce the afterimage phenomenon somewhat.

Figure 7A:
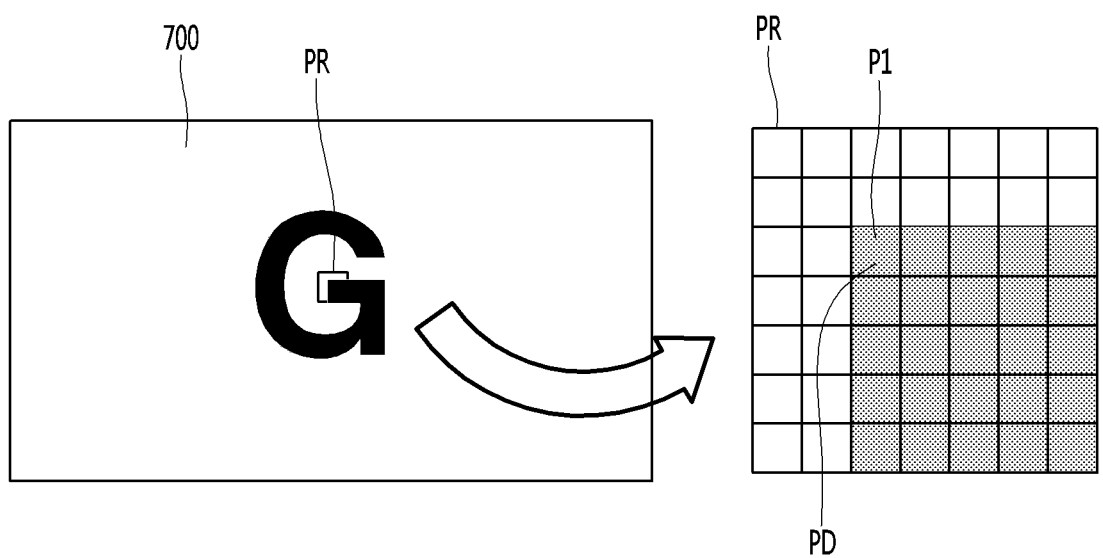
FIGS. 7A to 7D are views illustrating an orbit operation of the OLED display device.

Referring to FIG. 7A with reference to the orbit operation, the display device 100 can display an image 700 through the display unit 180. For example, although the image 700 is a broadcast image received through the broadcast reception unit 130, an embodiment of the present disclosure is not limited thereto. For example, the image 700 may correspond to various images provided from the network interface unit 133, the external device interface unit 135, or the memory 140. When a predetermined pixel area PR of the display unit 180 is enlarged and viewed, it is seen that predetermined pixel data PD within the image 700 is displayed at a position of a first pixel P1 of the display unit 180.

Figure 7B:
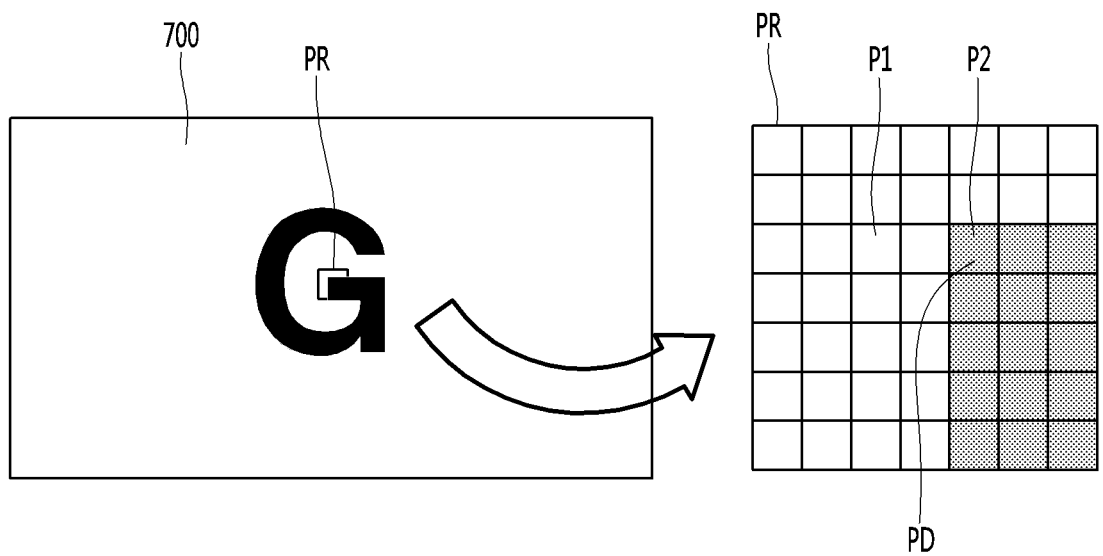

Referring to FIG. 7B, when a predetermined pixel area PR of the display unit 180 after a predetermined time (for example, 3 minutes) elapses is enlarged and viewed from FIG. 7A, it is seen that predetermined pixel data PD within an image 701 is displayed on a position of a second pixel P2 rather than the first pixel P1. That is, the display device 100 can display the image 701 on the position that moves by a predetermined pixel (for example, two pixels in a right direction) from the image 700 of FIG. 7A.

Figure 7C:
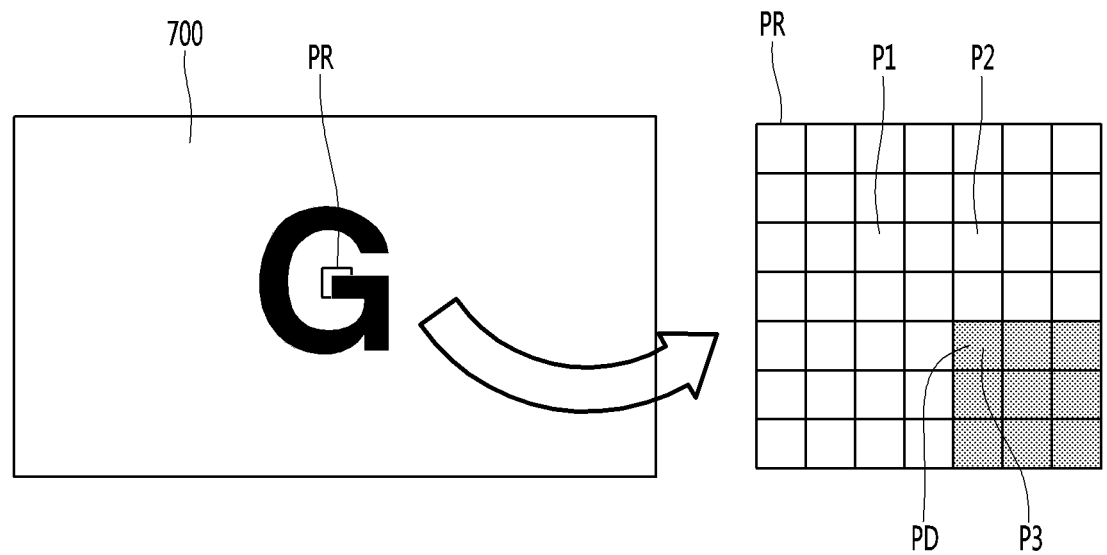

Referring to FIG. 7C, when a predetermined pixel area PR of the display unit 180 after the predetermined time elapses is enlarged and viewed from FIG. 7B, it is seen that predetermined pixel data PD within an image 702 is displayed on a position of a third pixel P3 rather than the second pixel P2. That is, the display device 100 can display the image 702 on the position that moves by a predetermined pixel (for example, two pixels in a downward direction) from the image 701 of FIG. 7B.

Figure 7D:
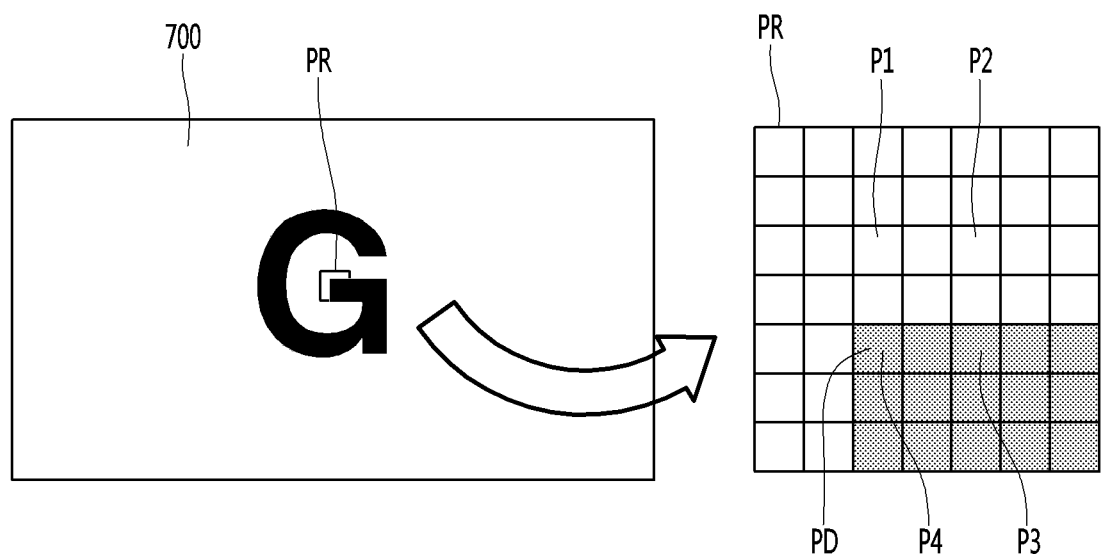

Referring to FIG. 7D, when a predetermined pixel area PR of the display unit 180 after the predetermined time elapses is enlarged and viewed from FIG. 7C, it is seen that predetermined pixel data PD within an image 703 is displayed on a position of a third pixel P3 rather than the third pixel P3. That is, the display device 100 can display the image 703 on the position that moves by a predetermined pixel (for example, two pixels in a left direction) from the image 702 of FIG. 7C.

Also, when a predetermined pixel area PR of the display unit 180 after the predetermined time elapses is enlarged from FIG. 7D, pixel data PD can be displayed on the position of the first pixel P1 as illustrated in FIG. 7A. That is, the display device 100 can repeatedly perform the movement operation of the image as the time elapses as illustrated in FIGS. 7A to 7D to display the image. This operation can be defined as an orbit operation. In the embodiment of FIGS. 7A to 7D, the movement path can correspond to a path successively having two pixels to the right direction, two pixel to the downward direction, two pixels to a left direction, and two pixels to an upward direction.

Due to the above-described orbit operation, the afterimage phenomenon of the display device 100 can be reduced somewhat. However, when the same orbit operation is performed when the image displayed by the display device 100 has high brightness, or a color amount of specific color is high or when the image has low brightness, or a color amount of specific color is low, it is inefficient or difficult to effectively reduce the afterimage phenomenon.

Hereinafter, various embodiments relating to the orbit operation, which is performed by the OLED display device according to an embodiment, will be described with reference to FIGS. 8 to 15. In particular, FIG. 8 is a flowchart illustrating a method for operating the OLED display device according to an embodiment.

Figure 8:
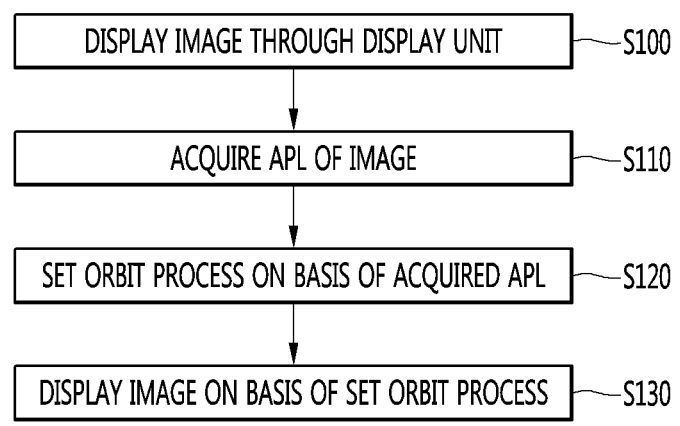
FIG. 8 is a flowchart illustrating a method for operating the OLED display device according to an embodiment.

Referring to FIG. 8, a display device 100 can display an image through a display unit 180 (S100), and the display device 100 can acquire an average picture level (APL) of the image (S110). The APL means average brightness of the image. The controller 170 of the display device 100 can calculate an average brightness with respect to a specific frame of an image received from the broadcast reception unit 130, the network interface unit 133, the external device interface unit 135, and the like to acquire an APL of the image. According to an embodiment, the controller 170 can calculate the average brightness and the color amount to acquire the APL.

In addition, the controller 170 can acquire the APL at a predetermined frame interval or acquire the APL at a predetermined time interval. That is, the controller 170 can periodically acquire the APL of the image. Here, the acquisition period of the APL can be previously set or be changed by the user as occasion demands.

The display device 100 can set an orbit process based on the acquired APL (S120) and display an image based on the set orbit process (S130). The orbit process can include a movement path and a movement period. That is, the controller 170 can set the movement path and the movement period based on the APL of the image. The movement period can mean a time when an image moves to one pixel along the movement path.

Further, the controller 170 can control the display unit 180 so that an image displayed on the display unit 180 is displayed while moving along the movement path for each movement period based on the set orbit process. A time that is taken to perform the orbit operation of 1 cycle by the controller 170 according to the set orbit process can correspond to the product of the total movement distance of the movement path (or the number of pixels within the movement path) and the movement period.

The controller 170 can also acquire the APL at the predetermined frame interval or the predetermined time interval to reset the orbit process based on a variation in APL of the image. The operation S120 will be described below in more detail with reference to an embodiment of FIG. 9.

Figure 9:
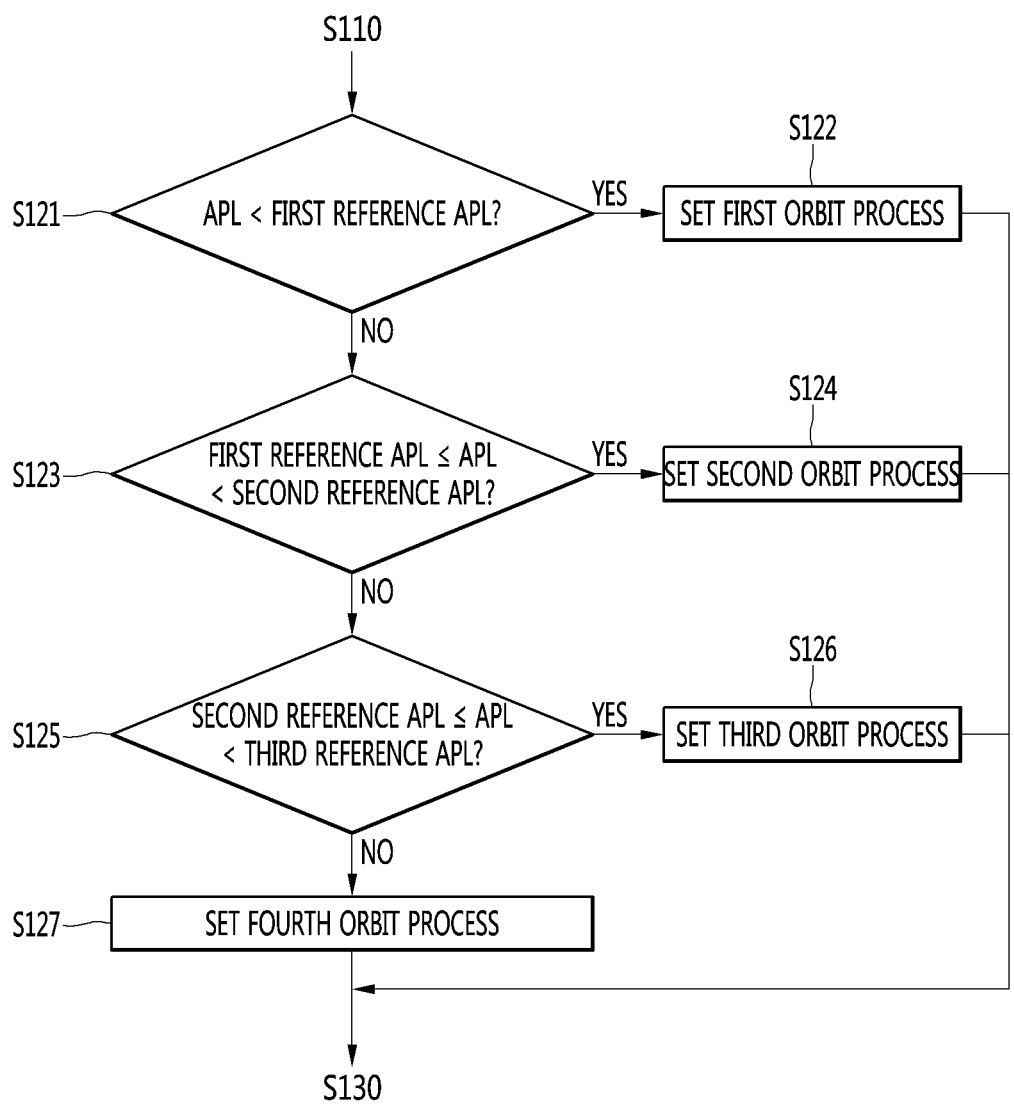
FIG. 9 is a flowchart illustrating an example relating to a setting operation in an orbit process of FIG. 8.

In particular, FIG. 9 is a flowchart illustrating an example relating to the setting operation in the orbit process of FIG. 8. Referring to FIG. 9, the display device 100 can compare the acquired APL with a plurality of reference APLs. The plurality of reference APLs can be stored in the memory 140 as a previously set value. In FIG. 9, the plurality of reference APLs may include three reference APLs. Thus, although the whole APL is divided into four sections, the number of reference APLs may be variously changed according to an embodiment.

In the display device 100, when the acquire APL is less than a first reference APL (YES in operation S121), an orbit process for the orbit operation of the image can be set as a first orbit process (S122). Here, it is assumed that the first orbit process is a process in which the orbit operation is not performed. That is, the controller 170 can not perform the orbit operation when the acquired APL is less than the first reference APL to reduce a workload of the controller 170.

The display device 100 can set the orbit process to a second orbit process (S124) when the acquired APL is greater than the first reference APL and less than the second reference APL (YES in operation S123). The second reference APL may have a value higher than the first reference APL.

Figure 10:
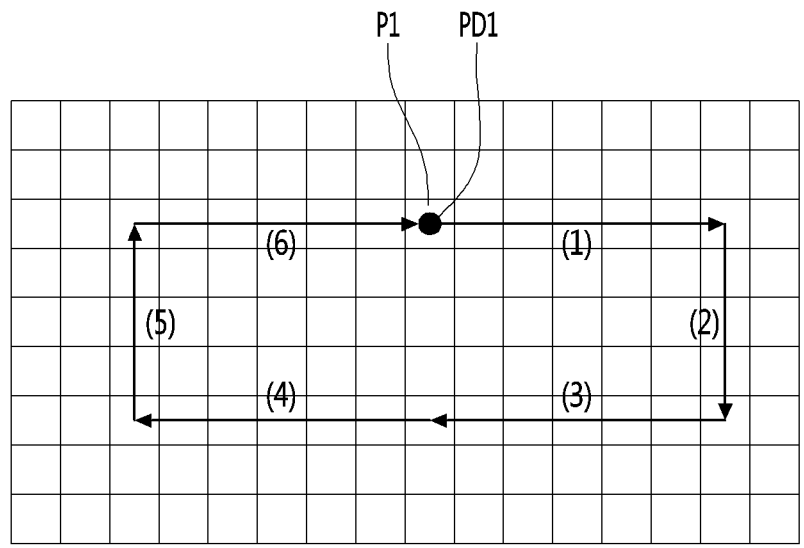
FIGS. 10 to 12 are views illustrating examples in the orbit process, which are set based on an APL of an image displayed through the OLED display device.

In addition, it is assumed that the second orbit process has a first movement path and a first movement period, which are illustrated in FIG. 10. The display device 100 can set the orbit process to a third orbit process (S126) when the acquired APL is greater than the second reference APL and less than the third reference APL (YES in operation S123).

Figure 11:
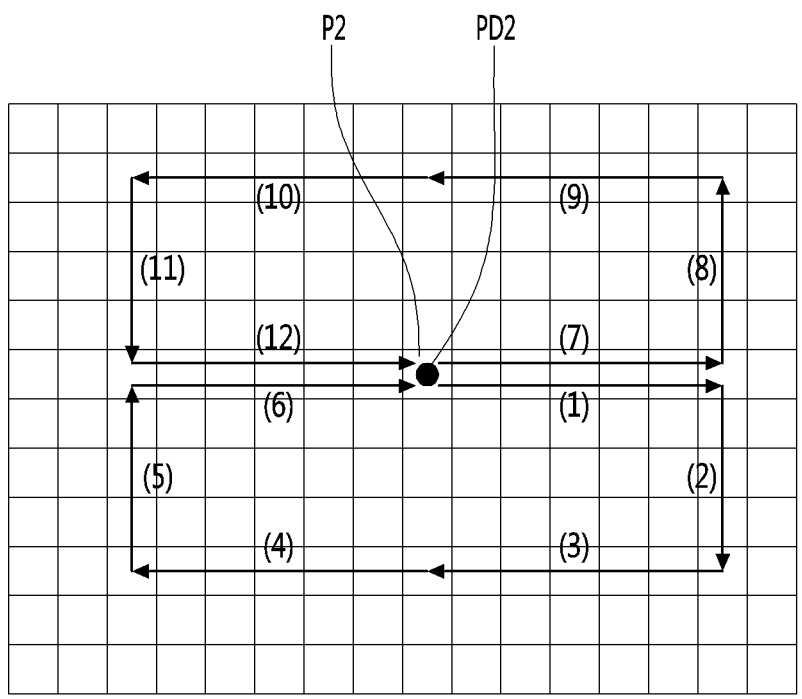

The third reference APL may have a value higher than the second reference APL. It is assumed that the third orbit process has a second movement path and a second movement period, which are illustrated in FIG. 11. Here, the total movement distance of the second movement path may be greater than that of the first movement path, or the second movement period may be less than the first movement period. Alternatively, the movement amount of image per time in the third orbit process may be greater than that of image per time in the second orbit process.

Figure 12:
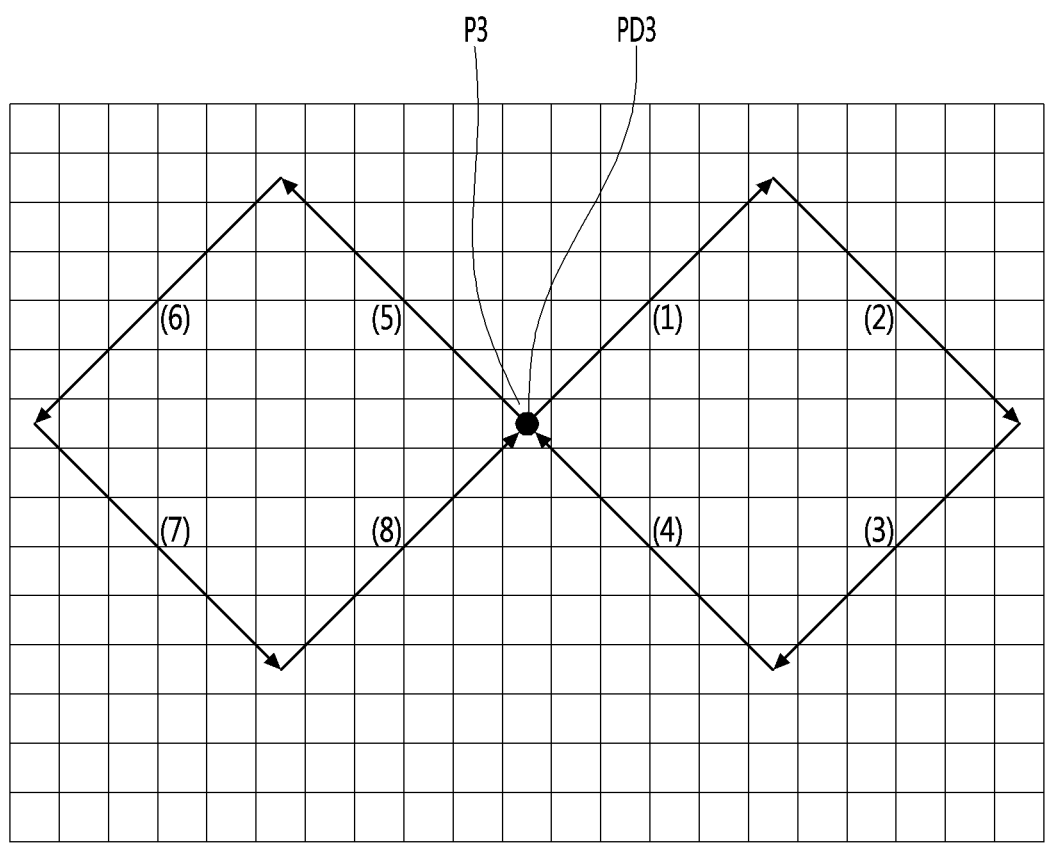

The display device 100 can set the orbit process to a fourth orbit process (S127) when the acquired APL is greater than the third reference APL (No in operation S125). It is assumed that the fourth orbit process has a third movement path and a third movement period, which are illustrated in FIG. 12. Here, the total movement distance of the third movement path may be greater than that of the second movement path, or the third movement period may be less than the second movement period. Alternatively, the movement amount of image per time in the fourth orbit process may be greater than that of image per time in the third orbit process.

That is, in the display device 100, the more the acquired APL increases, the more the movement period can decrease, the more the total movement distance of the movement path can increase, or the movement amount of image per time can increase. Thus, even though the display device 100 displays an image having high brightness, the degradation of the elements can be effectively dispersed to effectively reduce the afterimage phenomenon.

FIGS. 10 to 12 are views illustrating examples in the orbit process, which are set based on an APL of an image displayed through the OLED display device. An orbit process illustrated in FIG. 10 can correspond to the above-described second orbit process illustrated in FIG. 9, and an orbit process illustrated in FIG. 11 can correspond to the above-described third orbit process illustrated in FIG. 9. Also, an orbit process illustrated in FIG. 12 can correspond to the above-described fourth orbit process illustrated in FIG. 9.

Referring to FIG. 10, the second orbit process may have a first movement path and a first movement period. For example, the first movement path may have a path in a rectangular shape successively having 6 pixels in a right direction, 4 pixels in a downward direction, 12 pixels in a left direction, 4 pixels in an upward direction, and 6 pixels in a right direction. In this instance, the total movement distance of the first movement path can correspond to 32 pixels. When it is assumed that the first movement period is three minutes, an image can move by one pixel along the first movement path every three minutes and then be displayed. That is, in the second orbit process, a movement amount of image per time (minute) may be ⅓ pixels.

As illustrated in FIG. 10, first pixel data PD1 of an image can be initially displayed on the first pixel P1 of the display unit 180 and then be displayed by moving by one pixel along the first movement path every first movement period. In this instance, the first pixel data PD1 can be disposed again on the first pixel P1 after 96 minutes elapse. That is, in the second orbit process, a time that is taken to perform the orbit operation of one cycle may correspond to 96 minutes.

Referring to FIG. 11, the third orbit process may have a second movement path and a second movement period. For example, the second movement path may have a path in an 8-like shape successively having 6 pixels in the right direction, 4 pixels in the downward direction, 12 pixels in the left direction, 4 pixels in the upward direction, 12 pixels in the right direction, 4 pixels in the upward direction, 12 pixels in the left direction, 4 pixels in the downward direction, and 6 pixels in the right direction. In this instance, the total movement distance of the second movement path may correspond to 64 pixels. That is, the total movement distance of the second movement path may be greater than that of the first movement path.

Also, the second movement period may be less than the first movement period. For example, when it is assumed that the second movement period is two minutes, an image may move by one pixel along the second movement path every two minutes and then be displayed. That is, in the third orbit process, a movement amount of image per time (minute) may be ½ pixels and greater than that of image per time in the second orbit process.

As illustrated in FIG. 11, second pixel data PD2 of an image may be initially displayed on the second pixel P2 of the display unit 180 and then be displayed by moving by one pixel along the second movement path every second movement period. In this instance, the second pixel data PD2 may be disposed again on the second pixel P2 after 128 minutes elapse. That is, in the third orbit process, a time that is taken to perform the orbit operation of one cycle may correspond to 128 minutes.

Referring to FIG. 12, the fourth orbit process may have a third movement path and a third movement period. For example, the third movement path may have a path in an 8-like shape, which horizontally lies, successively having total 10 pixels in a right and upward diagonal direction, which include 5 pixels in the right direction and 5 pixels in the upward direction, total 10 pixels in a right and downward diagonal direction, which include 5 pixels in the right direction and 5 pixels in the downward direction, total 10 pixels in a left and downward diagonal direction, which include 5 pixels in the left direction and 5 pixels in the downward direction, total 20 pixels in a left and upward diagonal direction, which include 10 pixels in the left direction and 10 pixels in the upward direction, total 10 pixels in a left and downward diagonal direction, which include 5 pixels in the left direction and 5 pixels in the downward direction, total 10 pixels in a right and downward diagonal direction, which include 5 pixels in the right direction and 5 pixels in the downward direction, and total 10 pixels in a left and upward diagonal direction, which include 5 pixels in the left direction and 5 pixels in the upward direction. In this instance, the total movement distance of the third movement path may correspond to 80 pixels. That is, the total movement distance of the third movement path may be greater than that of the first movement path and that of the second movement path.

Also, the third movement period may be less than the second movement period. For example, when it is assumed that the third movement period is one minute, an image can move by one pixel in a horizontal direction and one pixel in a vertical direction (total two pixels) along the third movement path every one minute and then be displayed. That is, in the fourth orbit process, a movement amount of image per time (minute) may be 2 pixels and greater than that of image per time in the third orbit process.

As illustrated in FIG. 12, third pixel data PD3 of an image can be initially displayed on the third pixel P3 of the display unit 180 and then be displayed by moving by two pixels along the third movement path every third movement period. In this instance, the third pixel data PD3 can be disposed again on the third pixel P3 after 40 minutes elapse. That is, in the fourth orbit process, a time that is taken to perform the orbit operation of one cycle may correspond to 40 minutes.

As described above, when the orbit operation is performed by using different orbit processes based on the APL of the image, even though the display device 100 displays an image having high brightness, the degradation of the elements can be effectively dispersed to effectively reduce the afterimage phenomenon. In addition, since the degradation dispersion of the elements is maximized due to the diversity of the movement path, the afterimage can be more effectively reduced.

The plurality of movement paths and movement periods can be directly set by the user. For example, the display device 100 can provide a setting function for setting the orbit operation, and the user can select or set the movement path and the movement period through the setting function or set an on/off of the orbit operation.

When the display device 100 performs the orbit operation, and thus, the image is displayed by moving on the display unit 180, a blank area on which the pixel data does not exist can occur on the display unit 180. The blank area can occur on an edge of one side of the display unit 180. In this instance, the controller 170 can control the display unit 180 so that the pixels existing on the blank area outputs the pixel data output from the former frame at it is, or the same pixel data as that output from the adjacent pixel is output. Thus, the blank area of the display unit 180 can be recognized by the user to solve unnaturalness.

Figure 13:
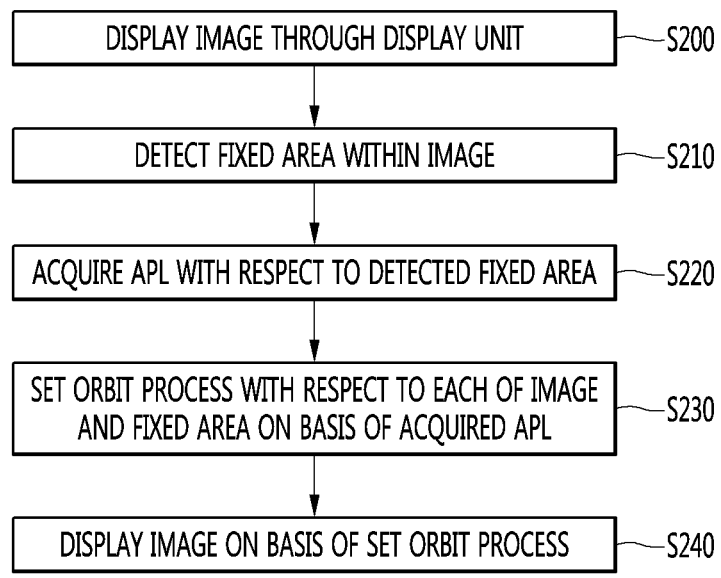
FIG. 13 is a flowchart illustrating a method for operating an OLED display device according to another embodiment.
Figure 14:
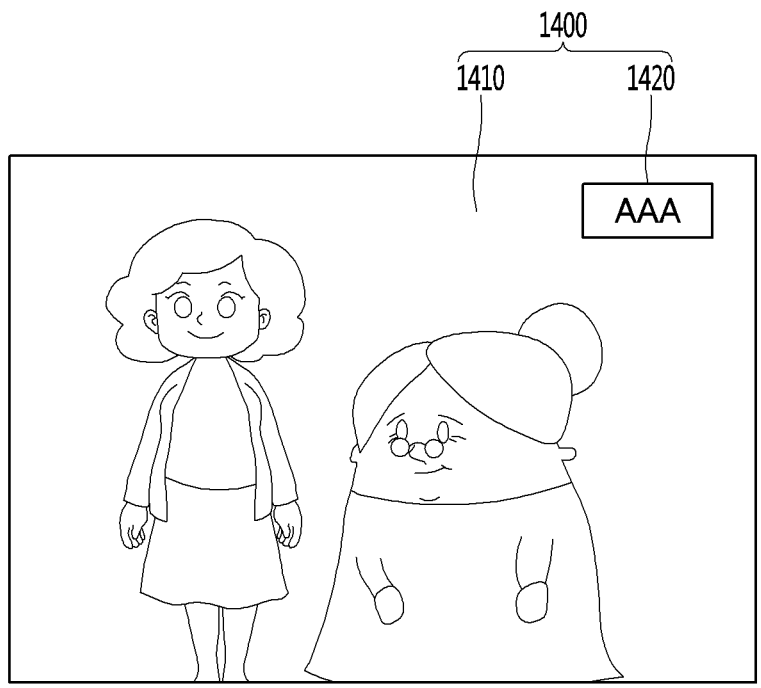
FIGS. 14 and 15 are views illustrating examples relating to the method for operating the OLED display device of FIG. 13.
Figure 15:
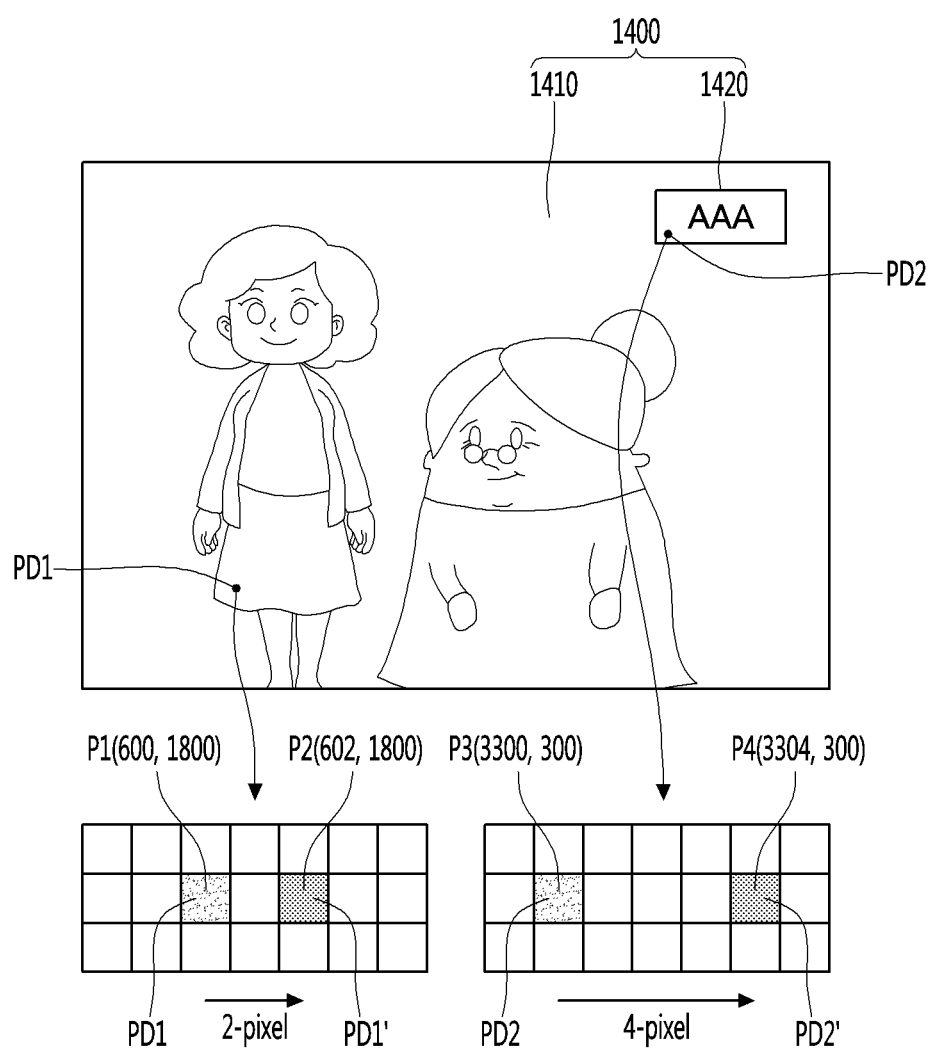

Next, FIG. 13 is a flowchart illustrating a method for operating an OLED display device according to another embodiment, and FIGS. 14 and 15 are views illustrating examples relating to the method for operating the OLED display device of FIG. 13. In general, an image may include an area (defined as a changing area) having variable pixel data when a frame elapses and an area (defined as a fixed area) having the same pixel data when the frame elapses.

When a display device 100 displays the image on the display unit 180, pixels corresponding to the changing areas can change a kind or brightness of emitted light by changing the pixel data. Further, the pixels corresponding to the fixed areas can constantly maintain the kind or brightness of emitted light because the pixel data are the same. In this instance, an afterimage phenomenon may occur on the display device 100 due to degradation of the pixels corresponding to the fixed areas. The afterimage phenomenon of the display device 100 may occur due to the fixed areas within the image.

Referring to FIG. 13, the display device 100 can display an image through the display unit 180 (S200) and detect a fixed area within the image (S210). Here, a brightness or a color amount can be acquired from each of frames of the image, and the acquired brightness or color amounts can be compared with each other to detect the fixed area within the image. However, when the brightness or the color amount are acquired from the pixels of the display unit 180 and then compared with each other, an amount of computation can be excessive to reduce a processing rate.

To solve this limitation, for example, the display device 100 can divide the image into a plurality of blocks, and an APL of each of the blocks can be acquired from each of the frames. The display device 100 can detect the blocks, in which the APLs acquired from the frames are the same, as the fixed area. That is, the display device 100 can acquire the APLs based on the blocks to detect the fixed areas, thereby effectively reducing the amount of computation.

The display device 100 can acquire the APLs with respect to the detected fixed areas (S220) and set an orbit process with respect to each of the image and the fixed areas based on the acquired APLs (S230). In addition, the display device 100 can display an image based on the set orbit process (S240). The controller 170 can acquire the APLs with respect to the fixed areas instead of the APLs with respect to the entire area of the image. Alternatively, according to embodiments, the controller 170 can separately acquire APLs with respect to the changing areas.

The controller 170 can set an orbit process with respect to each of the image (changing areas) and the fixed areas based on the acquired APLs with respect to the fixed areas. For example, the controller 170 can set the orbit process so that the orbit process with respect to the changing areas and the orbit process with respect to the fixed areas are the same, or at least one of a movement path and a movement period of the orbit process is different from each other.

When the orbit process with respect to the changing areas and the orbit process with respect to the fixed areas are set to be different from each other will be described in more detail. It is assumed that the orbit process set with respect to the changing areas is a first orbit process having a first movement path and a first movable period, and the orbit process set with respect to the fixed areas is a second orbit process having a second movement path and a second movement period. In this instance, the total movement distance of the second movement path may be greater than that of the first movement path, or the second movement period may be less than the first movement period. Also, a movement amount per time in the fixed areas may be greater than a movement amount of per in the changing areas.

Referring to FIG. 14, the controller 170 can display an image 1400 including changing areas 1410 and fixed areas 1420 through the display unit 180. The controller 170 can also acquire APLs of the fixed areas 1420 at a predetermined frame interval or a predetermined time interval and set orbit processes of the changing areas 1410 and the fixed areas 1420 based on the acquired APLs.

Referring to FIG. 15, pixel data included in the changing areas 1410 can be changed in value as a time elapses. For example, first pixel data PD1 with respect to a specific position of the changing areas 1410 at a first time point can be different from first pixel data PD1' with respect to the specific position at a second time point.

Further, pixel data included in the fixed areas 1420 may not be changed in value as a time elapses. For example, second pixel data PD2 with respect to a specific position of the fixed areas 1420 at a first time point may be different from second pixel data PD2' with respect to the specific position at a second time point.

The controller 170 can allow an image 1400 to move to be displayed as a time elapses based on the orbit process set with respect to each of the changing areas 1410 and the fixed areas 1420. At the first time point, the controller 170 can display the first pixel data PD1 on the position of the first pixel P1 of the display unit 180 and display the second pixel data PD2 on a position of a third pixel P3 of the display unit 180.

At the second time point, the controller 170 can allow the first pixel data PD1' to move to the position of the second pixel P2 and thereby to display the first pixel data PD1'. The second pixel P2 can correspond to a pixel that is disposed at a position moving by two pixels from the first pixel P1 in a right direction. That is, the controller 170 can allow the changing area 1410 to move by two pixels in the right direction at the second time point and thereby to display the changing area 1410.

Further, at the second time point, the controller 170 can allow the second pixel data PD2' to move to a position of a fourth pixel P4 and thereby to display the second pixel data PD2'. The fourth pixel P4 can correspond to a pixel that is disposed at a position moving by four pixels from the third pixel P3 in the right direction. That is, the controller 170 can allow the fixed area 1420 to move by four pixels in the right direction at the second time point and thereby to display the fixed area 1420.

As illustrated in FIG. 15, the controller 170 can set the orbit process so that the orbit process of the changing area 1410 and the orbit process of the fixed area 1420 are different from each other when the orbit operation of the image is performed. Particularly, the controller 170 can set the movement period of the fixed area 1420 so that the movement period of the fixed area 1420 is less than that of the changing area 1410 or set a movement amount of fixed area 1420 per time so that the movement amount of fixed area 1420 per time is greater than that of changing area 1410 per time. Therefore, the afterimage phenomenon, which may occur in the fixed area 1420, can be more effectively reduced to solve the user's inconvenience due to the afterimage phenomenon.

According to an embodiment, the above-described method may also be embodied as processor readable codes on a processor readable recording medium. Examples of the processor readable medium include read-only memory (ROM), random-access memory (RAM), CD-ROMs, magnetic tapes, floppy disks, and optical data storage devices.

In the display device described as described above, the embodiments set forth therein is not so limitedly, but all or part of the embodiments may be selectively combined so as to derive many variations. According to the various embodiments, the OLED display device may perform the orbit operation with the movement path and the movement period based on the APL of the displayed image, and thus, even through the image having the high brightness is displayed, the degradation of the OLED elements may be effectively dispersed to effectively reduce the afterimage phenomenon. In addition, since the degradation dispersion of the elements is maximized due to the diversity of the movement path, the afterimage may be more effectively reduced.

Also, the OLED display device can control the display unit so that the same pixel data as that output from the pixel that is disposed on the adjacent area is output on the blank area generated when the image is displayed while moving on the display unit because the orbit operation is performed. Thus, the blank area of the display unit can be recognized by the user to solve the unnaturalness.

In addition, the OLED display device can detect the fixed area within the image to differently set the movement path or the movement period of the fixed area from the movement path or the movement period of the changing area. Therefore, the afterimage phenomenon, which may occur in the fixed area, can be more effectively reduced to solve the user's inconvenience due to the afterimage phenomenon.

Although embodiments have been described with reference to a number of illustrative embodiments thereof, it should be understood that numerous other modifications and embodiments may be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting diode (OLED) display device comprising:
a display unit including pixels constituted by OLEDs; and
a controller configured to:
display an image through the display unit,
acquire an average picture level (APL) of the image,
set a movement path and a movement period of the image on the display based on the acquired APL, and
move the image on the display unit based on the set movement path and the movement period,
wherein the image comprises a changing area and a fixed area, and
wherein the controller is further configured to:
detect the fixed area of the image,
acquire an APL of the detected fixed area,
set a movement path and a movement period with respect to each of the changing area and the fixed area based on the acquired APL, and
move the image on the display unit based on the set movement path and movement period,
wherein the changing area comprises an area having variable pixel data when a frame of the image elapses, and
wherein the fixed area comprises an area having the same pixel data when the frame of the image elapses.

2. The OLED display device according to claim 1, wherein the controller is configured to:
set the movement path and the movement period to a first movement path and a first movement period when the acquired APL is a first APL, and
set the movement period to a second movement period different from the first movement period when the acquired APL is a second APL greater than the first APL.

3. The OLED display device according to claim 2, wherein the second movement period is less than the first movement period.

4. The OLED display device according to claim 2, wherein the controller is configured to set the movement path to a second movement path different from the first movement path when the acquired APL is the second APL.

5. The OLED display device according to claim 4, wherein a total movement distance of the second movement path is greater than that of the first movement path.

6. The OLED display device according to claim 2, wherein a movement amount of image per time when the acquired APL is the first APL is less than that of image per time when the acquired APL is the second APL.

7. The OLED display device according to claim 1, wherein the controller is configured to acquire the APL of the image at a predetermined frame interval or a predetermined time interval and reset the movement path and the movement period based on the acquired APL.

8. The OLED display device according to claim 1, wherein the controller is configured to move the image on the display unit so pixel data of a blank area occurring on the display unit is the same as pixel data of an adjacent area.

9. The OLED display device according to claim 1, wherein the controller is configured to set the movement path of the changing area and the movement path of the fixed area so that the movement paths are different from each other.

10. The OLED display device according to claim 9, wherein the movement path of the changing area is less than that of the fixed area.

11. The OLED display device according to claim 1, wherein the controller is configured to set the movement period of the changing area and the movement period of the fixed area so that the movement periods are different from each other.

12. The OLED display device according to claim 11, wherein the movement period of the changing area is greater than that of the fixed area.

13. A method for operating an organic light emitting diode (OLED) display device, the method comprising:
displaying an image through a display unit;
acquiring, via a controller of the OLED display device, an average picture level (APL) of the image;

setting, via the controller, a movement path and a movement period based on the acquired APL; and moving, via the controller, the image on the display unit based on the set movement path and the movable period, wherein the image comprises a changing area and a fixed area, wherein the acquiring of the APL of the image comprises:

detecting the fixed area of the image, and acquiring an APL of the detected fixed area, wherein of the movement path and the movement period comprises:

setting a movement path and a movement period with respect to each of the changing area and the fixed area based on the acquired APL, wherein the moving of the image on the display unit comprises:

moving the image on the display unit based on the set movement path and movement period, wherein the changing area comprises an area which a variance of pixel data is above a reference variance when a frame of the image elapses, and wherein the fixed area comprises an area which the variance of pixel data is equal to or less than the reference variance when the frame of the image elapses.

14. The method according to claim 13, wherein a total movement distance of the movement path increases as the APL increases.

15. The method according to claim 13, wherein a movement period decreases as the APL increases.

16. The method according to claim 13, wherein the movement path of the changing area and the movement path of the fixed area are different from each other.

17. The method according to claim 16, wherein the movement period of the changing area and the movement period of the fixed area are different from each other.

\* \* \* \* \*